US007668031B2

(12) United States Patent
Kang et al.

(10) Patent No.: US 7,668,031 B2
(45) Date of Patent: Feb. 23, 2010

(54) SEMICONDUCTOR MEMORY DEVICE WITH FERROELECTRIC DEVICE

(75) Inventors: Hee Bok Kang, Cheongju-si (KR); Jin Hong An, Yongin-si (KR); Suk Kyoung Hong, Gwacheon-si (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 222 days.

(21) Appl. No.: 11/967,531

(22) Filed: Dec. 31, 2007

(65) Prior Publication Data
US 2009/0010054 A1    Jan. 8, 2009

(30) Foreign Application Priority Data
Jul. 4, 2007    (KR) ...................... 10-2007-0067037

(51) Int. Cl.
*G11C 7/02*    (2006.01)
(52) U.S. Cl. .................................. 365/210.1; 365/145
(58) Field of Classification Search .............. 365/210.1, 365/145
See application file for complete search history.

(56) References Cited
U.S. PATENT DOCUMENTS
6,026,009 A * 2/2000 Choi et al. ................... 365/145
2003/0206430 A1 11/2003 Ho FOREIGN PATENT DOCUMENTS
KR    10-2005-0127038    4/2007
KR    10-2006-0070964    5/2007
KR    10-2007-0065033    6/2007

OTHER PUBLICATIONS
Notice of Rejection from Korean Intellectual Property Office dated Apr. 25, 2008.
English Language Abstract of KR 10-2006-0070964.
English Language Abstract of KR 10-2005-0127038.

* cited by examiner

*Primary Examiner*—Son Dinh
*Assistant Examiner*—Nam Nguyen
(74) *Attorney, Agent, or Firm*—IP & T Law Firm PLC

(57) ABSTRACT

A semiconductor memory device includes a one-transistor (1-T) field effect transistor (FET) type memory cell connected between a pair of bit lines, and controlled by a word line, where a different channel resistance is induced to a channel region depending on a polarity state of a ferroelectric layer. The device includes a plurality of word lines arranged in a row direction, a plurality of bit lines arranged in a column direction, a pair of clamp dummy lines arranged in the column direction, a pair of reference dummy lines arranged in the column direction, a cell array including the memory cell and formed in a region where the word line and the bit line are crossed, a dummy cell array including the memory cell and formed where the word line, the pair of claim dummy lines and the pair of reference dummy lines are crossed, and a sense amplifier and a write driving unit connected to the bit line and configured to receive a clamp voltage and a reference voltage.

23 Claims, 14 Drawing Sheets

US 7,668,031 B2

SEMICONDUCTOR MEMORY DEVICE WITH FERROELECTRIC DEVICE

RELATED APPLICATIONS

This application is based upon and claims the benefit of priority to Korean Patent Application No. 10-2007-0067037, filed on Jul. 4, 2007. The entire contents of this application is incorporated herein by reference.

TECHNICAL FIELD

Embodiments consistent with the present invention generally relate to a semiconductor memory device with a ferroelectric device, and more specifically, to a DRAM equipped with a 1T-FET type ferroelectric memory cell having a nonvolatile characteristic.

BACKGROUND

Generally, electric power should be continuously supplied in order to store data as a volatile memory in a Dynamic Random Access Memory (DRAM). When electric power is instantly disconnected, data of a RAM may be destroyed because a memory cell of the DRAM is designed based on small charged electrons for keeping a charged electric power. If these charged electrons are not continuously recharged the previously charged power can be destroyed.

A refresh operation refers to a recharging process of a cell of a memory chip. In every refresh cycle, memory cells of a row can be charged. Although the refresh operation is performed by memory control of the system, several chips are designed to perform a self-refresh operation.

For example, a DRAM has a self-refresh control circuit so as to perform a self-refresh operation without a Central Processing Unit (CPU) or an external refresh circuit. The self-refresh method to reduce power consumption has been used in a portable computer.

A conventional DRAM performs a refresh operation frequently because the DRAM is volatile and has a short refresh cycle. As a result, the frequent refresh operation increases power consumption and degrades performance.

Generally, a ferroelectric random access memory (FeRAM) has attracted considerable attention as a next generation memory device because it has a data processing speed as fast as a DRAM and conserves data even after the power is turned off.

The FeRAM having structures similar to the DRAM includes capacitors made of a ferroelectric substance, so that it can utilize the characteristic of a high residual polarization of the ferroelectric substance in which data is not deleted even after an electric field is eliminated.

A one-transistor 1-capacitor (1T1C) type unit cell of the conventional FeRAM comprises a switching element configured to perform a switching operation depending on a state of a word line and connect a bit line to a nonvolatile ferroelectric capacitor, and a nonvolatile ferroelectric capacitor connected between a plate line and one end of the switching element. Switching element is a NMOS transistor whose switching operation is controlled by a gate control signal.

However, the sensing efficiency of the sense amplifier is degraded when a reference voltage is not effectively controlled in the semiconductor memory device. As a result, the data sensing margin and yield of the whole chip is degraded.

SUMMARY

Consistent with the present invention a semiconductor memory device including a one-transistor (1-T) field effect transistor (FET) type memory cell where a different channel resistance is induced to a channel region depending on a polarity state of a ferroelectric layer, the device comprising, a plurality of word lines arranged in a row direction, a plurality of bit lines arranged in a column direction, a pair of clamp dummy lines arranged in the column direction, a pair of reference dummy lines arranged in the column direction, a cell array including the memory cell and formed in a region where the word line and the bit line are crossed, a dummy cell array including the memory cell and formed where the word line, the pair of claim dummy lines and the pair of reference dummy lines are crossed, and a sense amplifier and a write driving unit connected to the bit line and configured to receive a clamp voltage and a reference voltage.

DETAILED DESCRIPTION

Figure 1:
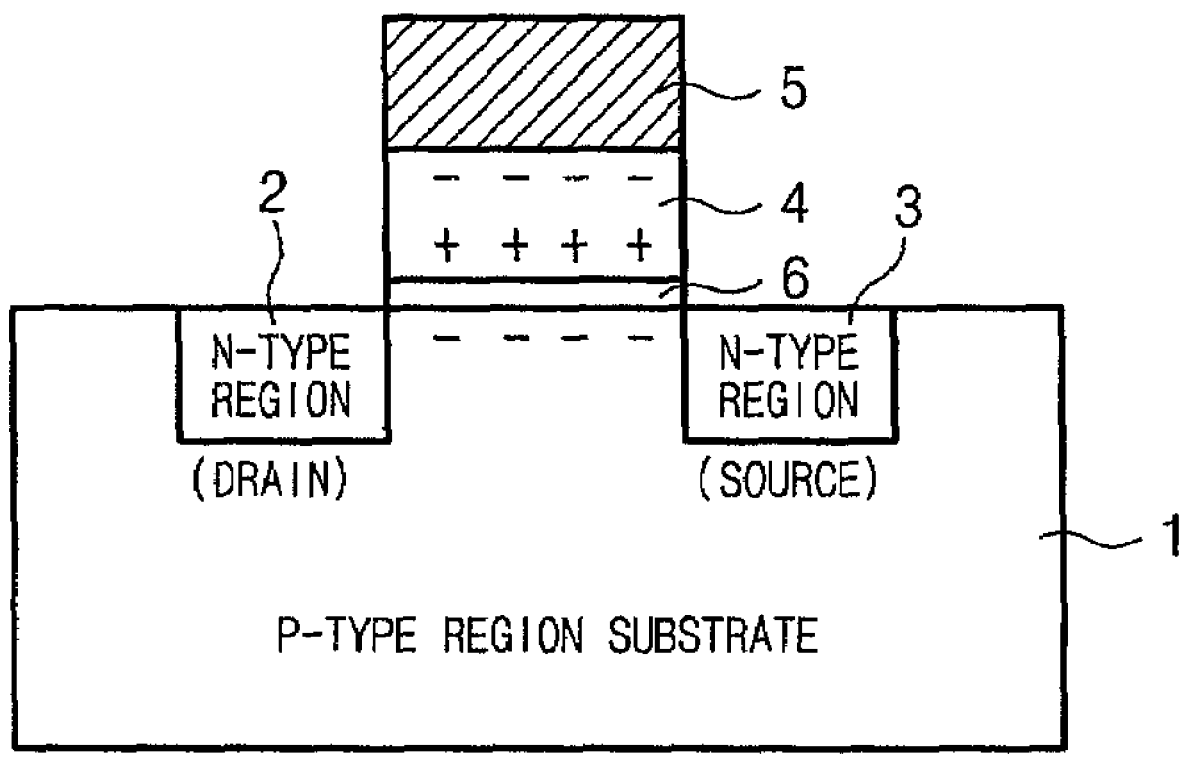
FIG. 1 is a cross-sectional diagram illustrating a semiconductor memory device.

FIG. 1 is a cross-sectional diagram illustrating a semiconductor memory device.

A One-Transistor (1-T) Field Effect Transistor (FET) type ferroelectric memory cell comprises a P-type channel region, a N-type drain region 2 and a N-type source region 3 which are formed in a P-type region substrate 1. A ferroelectric layer 4 is formed over the channel region, and a word line 5 is formed over ferroelectric layer 4.

A buffer insulating layer 6 is formed between the channel region and the ferroelectric layer 4 for stabilization of the process. That is, buffer insulating layer 6 is formed to eliminate process and material differences between the channel region and ferroelectric layer 4.

Semiconductor memory device reads and writes data in response to a channel resistance of the memory cell which is differentiated depending on a polarization state of ferroelectric layer 4.

When a polarity of ferroelectric layer 4 induces a positive charge to a channel, the memory cell becomes at a high resistance channel state to be off. On the other hand, when the polarity of ferroelectric layer 4 induces a negative charge to the channel, the memory cell becomes at a low resistance state to be on. Ferroelectric memory cell selects polarity kinds of ferroelectric layer 4 to write data in the cell so that the memory cell becomes nonvolatile.

Figure 2A:
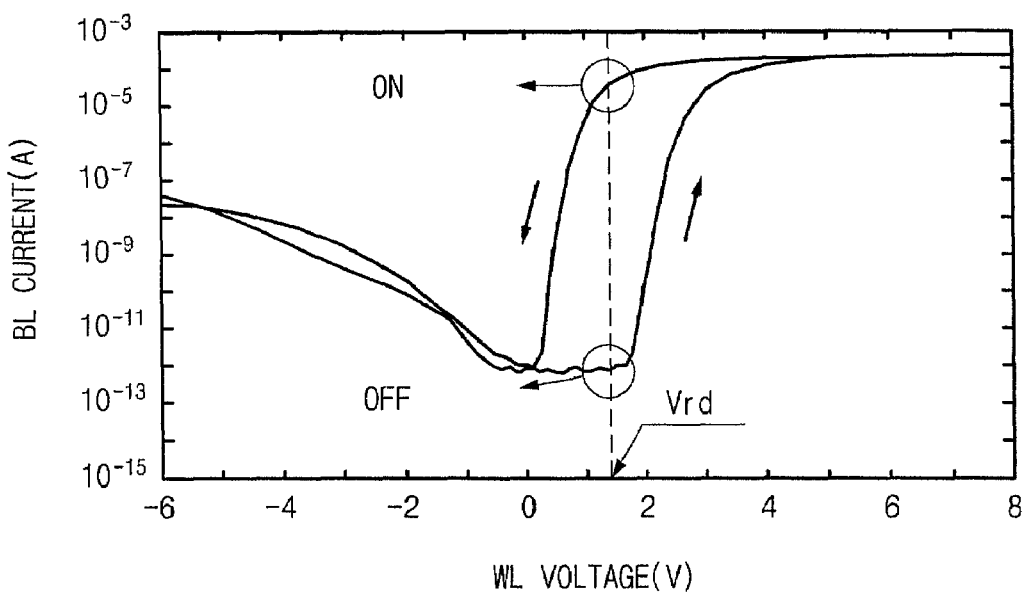
FIGS. 2a and 2b are graphs illustrating a bit line current in a read mode of a semiconductor memory device.
Figure 2B:
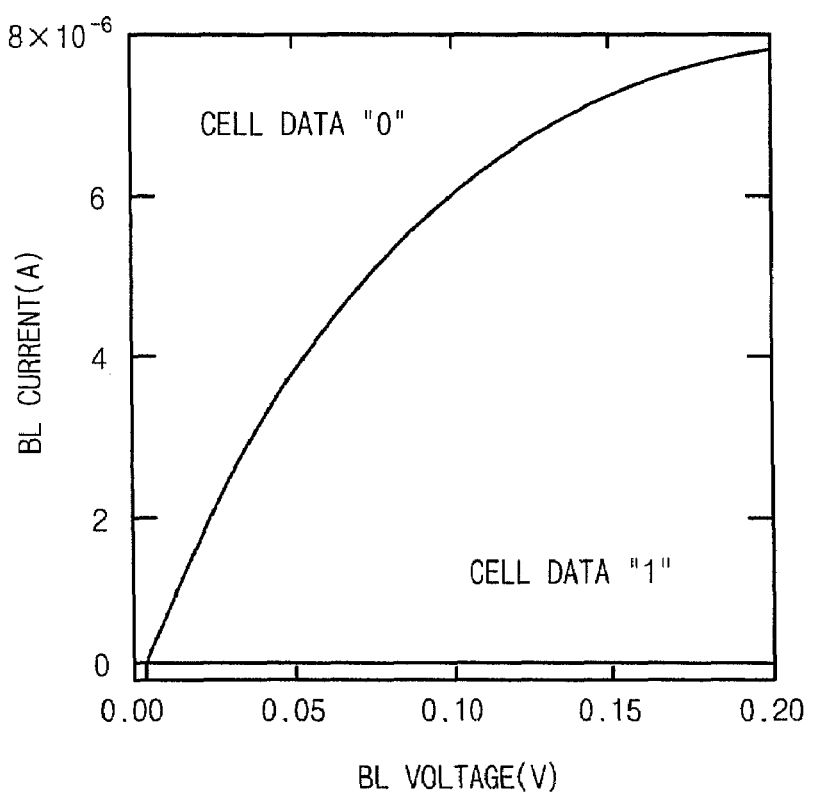

FIGS. 2a and 2b are graphs illustrating a bit line current in a read mode of a semiconductor memory device consistent with the present invention.

As shown in FIG. 2a, a voltage value when the P-type channel region is on/off is set to be a word line read voltage Vrd. With the word line read voltage Vrd, the largest amount of bit line BL current flows when the channel region is turned on, and the smallest amount of bit line BL current flows when the channel region is turned off.

As shown in FIG. 2b, when a voltage of the bit line BL is changed while the same word line read voltage Vrd is applied, the memory cell has a different current value of bit line BL depending on values of cell data stored in the memory cell. That is, when data "0" is stored in the memory cell, a large amount of bit line BL current flows with the increase of bit line BL voltage. When data "1" is stored in the memory cell, bit line BL current is not changed and flows with a small amount despite the increase of bit line BL voltage.

Figure 3:
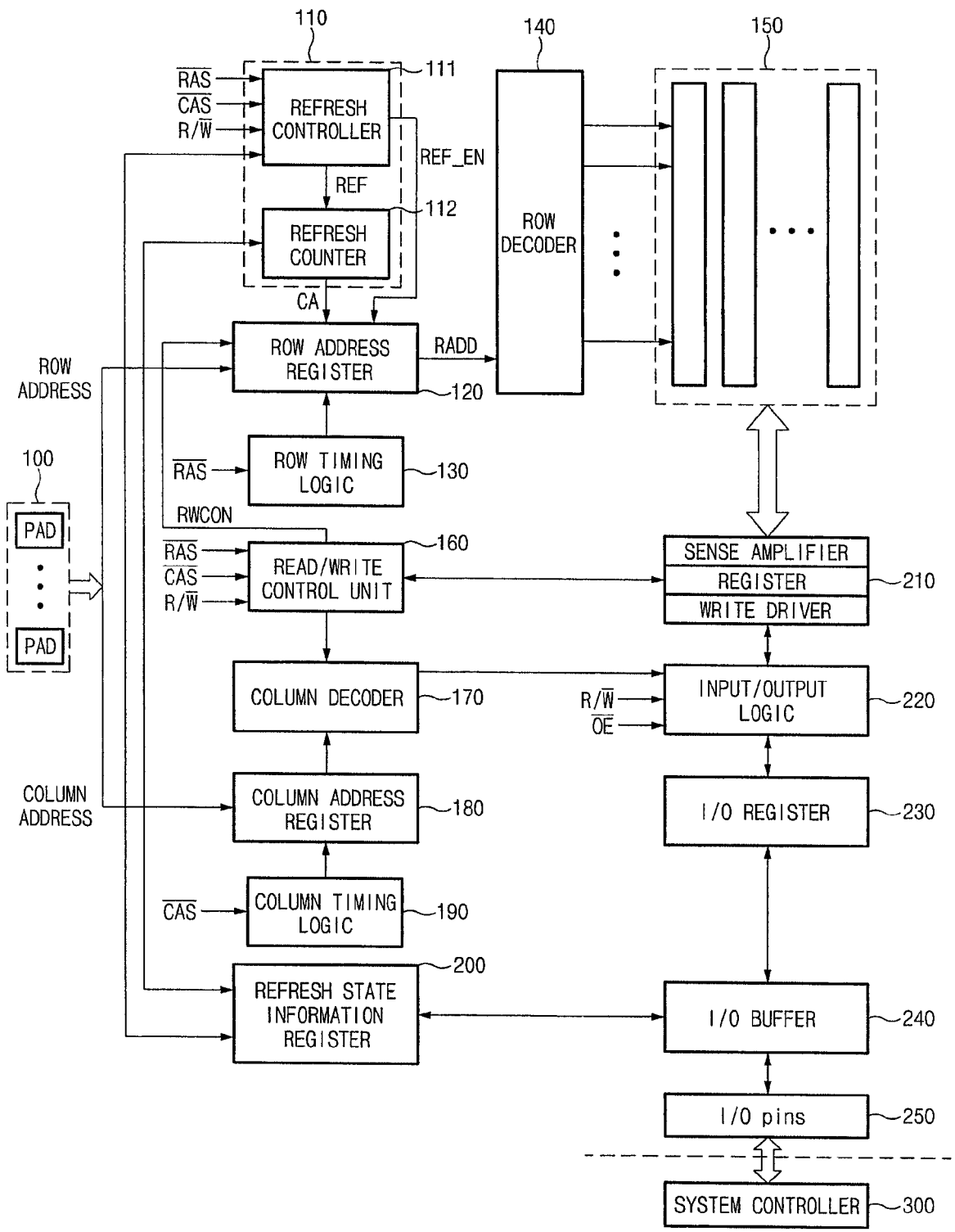
FIG. 3 is a diagram illustrating a semiconductor memory device consistent with the present invention.

FIG. 3 is a diagram illustrating a semiconductor memory device consistent with the present invention.

Semiconductor memory device comprises a pad array 100, a refresh control unit 110, a row address register 120, a row timing logic 130, a row decoder 140, a cell array 150, a read/write control unit 160, a column decoder 170, a column address register 180, a column timing logic 190, a refresh state information register 200, a sense amplifier, a register, a write driver 210, an input/output logic 220, an I/O register 230, a I/O buffer 240 and I/O pins 250.

Refresh control unit 110 includes a refresh controller 111 and a refresh counter 112. Cell array 150 includes a plurality of 1T-FET type unit cells of FIG. 1.

Pad array 100 includes a plurality of pads PAD each configured to receive a row address and a column address so as to output the addresses with a time variance. Refresh controller 111 outputs a refresh signal REF and a refresh enable signal REF_EN for controlling a refresh operation in response to a signal /RAS, a signal /CAS, a read/write command R,/W and a refresh control signal.

Refresh counter 112 counts a refresh cycle in response to refresh signal REF applied from refresh controller 111 and refresh control signal applied from refresh state information register 200 to output a count address CA. Refresh controller 111 and refresh counter 112 output refresh operation information and refresh count information into refresh state information register 200.

Row address register 120 receives the row address received from pad array unit 100 and stores the address temporarily.

Row address register 120 outputs a row address RADD to row decoder 140 in response to an output signal of row timing logic 130 and a read/write control signal RWCON applied from read/write control unit 160.

Row timing logic 130 controls the storage operation and address output timing of row address register 120 in response to the signal /RAS. Row decoder 140 decodes row address RADD applied from row address register 120 to output the address to cell array 150.

Read/write control unit 160 outputs read/write control signal RWCON for controlling read/write operations into row address register 120 in response to the signal /RAS, the signal /CAS and the read/write command R,/W so as to control the column decoder 170 and the sense amplifier, register and the write driver 210.

Column decoder 170 decodes a column address applied from column address register 180 depending on control of read/write control unit 160 to output the address to input/output logic 220. Column address register 180 temporarily stores the column address received from pad array 100 so as to output the address into column decoder 170 depending on control of column timing logic 190.

Column timing logic 190 controls the storage operation and address output timing of column address register 180 in response to the signal /CAS. Register 210 outputs refresh data to the memory cell depending on control of column timing logic 190 when refresh signal REF is activated.

Refresh state information register 200 is a nonvolatile register configured to store parameters related to refresh operations. Refresh state information register 200 stores refresh count information, power-off timing information of the system or internal memories and other parameter information Refresh state information register 200 outputs a refresh control signal based on the parameter information in the refresh operations. In the power-off timing, information of refresh control unit 111 and refresh counter 112 is transmitted into refresh state information register 200, and information related to external commands received from I/O buffer 240 is stored. The information stored in refresh state information register 200 through I/O buffer 240 and I/O pins 250 is outputted into a system controller 300.

Sense amplifier S/A may sense and amplify cell data to distinguish data "1" from data "0". Write driver W/D can generate a driving voltage in response to write data when data are written in the memory cell to supply the driving voltage to bit line BL. Register REG temporarily stores data sensed in the sense amplifier S/A, and re-stores data in the memory cell in the write operation.

Input/output logic 220 reads data stored in cell array 150 depending on an output signal from column decoder 170 and read/write commands R, /W, and stores data in cell array 150. Input/output logic 220 includes a column selecting signal C/S, and outputs data stored in cell array 150 to data I/O register 230 in response to an output enable signal /OE.

I/O buffer 240 buffers read data stored in I/O register 230 to output buffered data into I/O pins 250. I/O buffer 240 buffers write data received through I/O pins 250 to output buffered data into I/O register 230. I/O buffer 240 outputs information stored in refresh state information register 200 into the system controller 300 through the I/O pins 250.

I/O pins 250 outputs data received from I/O buffer 240 into system controller 300 through data buses, or outputs data from system controller 300 through the data buses into I/O buffer 240.

Read/write operations of the semiconductor memory device are explained as follows.

Pad array 100 receives a row address and a column address through a plurality of pads PAD, and outputs the addresses to row address register 120 and column address register 180.

Row address register 120 and column address register 180 output the row address and the column address with a given time difference depending on control of row timing logic 130 and column timing logic 190 by time multiplexing method.

Row address register 120 stores the row address temporarily in synchronization with the signal /RAS, and outputs row address RADD to row decoder 140. When the row address is outputted, column address register 180 stores the column address temporarily.

Row address register 120 selects a row address received from pad array 100 in a normal operation to output the address into row decoder 140. When a refresh enable signal REF_EN is activated in a refresh mode, row address register 120 selects a count address CA received from refresh counter 112 to output the address into row decoder 140.

Column address register 180 stores the column address temporarily in synchronization with the signal /CAS, and outputs the column address to column decoder 170. When the column address is outputted, row address register 120 stores the row address temporarily.

In the read mode, when an output enable signal /OE is activated while the read command R is activated, data stored in cell array 150 are outputted to I/O register 230 depending on input/output logic 220. On the other hand, in the write mode, when the output enable signal /OE is inactivated while the write command /W is activated, data are stored in cell array 150 depending on input/output logic 220.

Hereinafter, a refresh method of a semiconductor memory device is explained as follows.

Refresh controller 111 outputs refresh signal REF for performing a refresh operation into refresh counter 112, and outputs refresh enable signal REF_EN into row address register 120 in response to the signal /RAS, the signal /CAS, read/write commands R,/W and the refresh control signal when a refresh operation command is applied.

Refresh counter 112 counts a refresh cycle in response to refresh signal REF applied from refresh controller 111 and the refresh control signal to output a count address CA to row address register 120.

Count address CA outputted from refresh counter 112 is stored in row address register 120. Column timing logic 190 outputs data stored in column address register 180 into column decoder 170 in response to the signal /CAS. When sense amplifier S/A is activated, refresh data stored in register REG through input/output logic 220 are written in cell array 150.

Refresh signal REF may be a control signal using the signal /RAS and the signal /CAS. That is, when the refresh signal REF is a control signal using the signal /RAS and the signal /CAS, the refresh operation is performed with a /CAS before /RAS method (/CBR).

In the normal mode for performing read and write operations, the signal /RAS is activated faster than the signal /CAS so that a normal operation is performed depending on row timing logic 130 and column timing logic 190. When the signal /RAS is activated earlier, an external row address is activated so that sense amplifier S/A is activated. When the signal /CAS is activated, an external column address is activated.

In the refresh mode, refresh control unit 111 senses the signal /CAS transited earlier than the signal /RAS to activate refresh signal REF. That is, when refresh control unit 111 senses the signal /CAS transited earlier than the signal /RAS, refresh control unit 111 decides the refresh mode to activate refresh enable signal REF_EN.

Row address register 120 performs a refresh operation in response to count address CA generated depending on refresh counter 112 while a path of the normal mode is disconnected when refresh enable signal REF_EN is activated. Row address register 120 may sense simultaneous transition of the signal /CAS and the signal /RAS to activate the refresh signal REF.

Although the refresh method using the /CBR method is exemplified in the embodiment consistent with the present invention, the refresh operation may be performed by various methods with self-refresh, auto-refresh or clock.

In the refresh mode, a word line WL of cell array 150, is selected depending on count address CA which is an output signal of the refresh counter 112. As a result, data of the corresponding cell having a 1T-FET structure in cell array 150 are sensed and amplified, and stored in sense amplifier register REG. New data are written in cell array 150, or the data stored in register REG are re-stored in cell array 150.

Hereinafter, a refresh method of a semiconductor memory device depending on on/off of the power source is explained as follows.

When the power is turned on while a system power of the DRAM which is a volatile memory is turned off, data of the memory are uploaded so that a new refresh operation starts. That is, when the system power is turned on, data of the memory are required to be uploaded.

However, in the nonvolatile ferroelectric memory device according to an embodiment consistent with the present invention, when the power is turned on while the system power is turned off, refresh state information register 200 decides whether the refresh time is exceeded.

When the refresh time is exceeded, data of the memory are uploaded so that a new refresh operation starts. On the other hand, when the refresh time is not exceeded, the refresh time is effective so that the previous refresh operation continues.

Refresh state information register 200 stores a parameter related to the refresh operation in a nonvolatile register. Refresh state information register 200 stores refresh count information, power-off timing information of the system or internal memory and other parameter information to be nonvolatile. In refresh state information register 200, an additional power sensing unit (not shown) senses on/off states of the system or the internal memory.

When the power is off, data stored in refresh state information register 200 are read to calculate the refresh lapse time. The refresh lapse time can be stored in a mode register set MRS or controlled in a system level.

The refresh lapse time calculated in response to the refresh control signal is transmitted into refresh control unit 111 and the refresh operation is controlled. As a result, in the embodiment, it is unnecessary to upload the refresh related information even when the power is on.

Refresh method includes a distributed refresh method and a burst refresh method.

In the distributed refresh method, the refresh operation is performed with the same time distribution so that all cells may be refreshed within the refresh time in response to the count address CA counted in refresh counter 112.

That is, when 8 k rows are refreshed, each distributed refresh operation period is represented by (total refresh time)/8 k. As a result, the cell becomes initialized only when data are written in all word lines WL.

In the burst refresh method, 8 k refresh cycles are continuously performed within a burst refresh cycle time. Each pulse means each refresh cycle, and a normal operation is performed in read/write operation cycle periods where the pulse is inactivated.

In the refresh method of a nonvolatile ferroelectric memory device, a timer control operation is explained as follows.

Refresh state information register 200 identifies whether the system power is off, and stores the result. When the power is off, a system timer in the system is used while an internal memory timer is off so that the refresh operation is controlled. The system timer stores a date and a time with a battery while the power source is required to be on continuously.

On the other hand, when the power is not off, the internal memory timer operated individually is used so that the internal refresh operation is controlled.

One of the external system timer or the internal memory timer is selected depending on on/off states of the power through input/output data pins 250. That is, refresh state information register 200 of the memory device including the internal memory timer exchanges data with the data buses through I/O buffer 240 and I/O pins 250. The system CPU including the system timers exchanges data with the memory device through the data buses.

When the power is off through data exchange between the memory device and system controller 300, the refresh operation is performed with the external system timer whose power is continuously on. When the power is on, the refresh operation is performed with the internal memory timer.

As a result, the refresh period and the memory data are effectively maintained regardless of on/off state of the power of the memory chip. Between the refresh periods, the memory chip power is turned off to reduce power consumption, and a chip power is supplied only in the refresh period.

Figure 4:
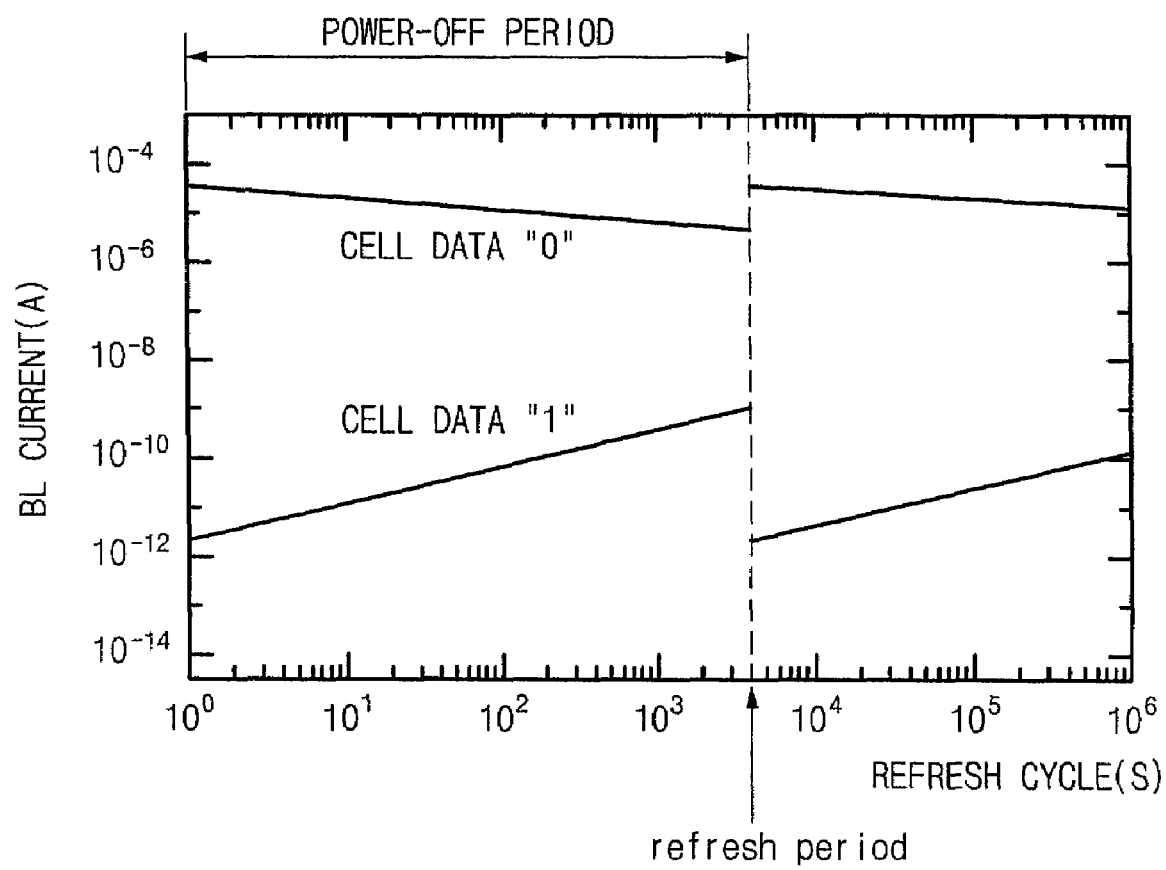
FIG. 4 is a graph illustrating a data retention characteristic of a semiconductor memory device consistent with the present invention.

FIG. 4 is a graph illustrating a data retention characteristic of a semiconductor memory device according to an embodiment consistent with the present invention.

As time passes, cell data of a conventional semiconductor memory device are degraded to cause limits of data retention life. As a result, bit line BL current corresponding to the cell data "1" and "0" is reduced as time passes by.

However, when the power is off, the refresh operation is performed with a given cycle at a given timing when bit line BL current is reduced, thereby restoring the degraded cell data to improve data retention characteristics.

When the data retention characteristics of the memory cell are reduced to over a pre-set target value, a refresh circuit is driven to restore the cell data at the initial state. The degradation limit target time of the cell becomes a refresh time so that all cells are operated within the refresh time.

Semiconductor memory device consistent with the present invention is a DRAM having nonvolatile characteristic. The on/off time of the power source is added and set as the whole data retention time so that the refresh operation is not frequently performed, thereby reducing power consumption and improving performance.

Figure 5:
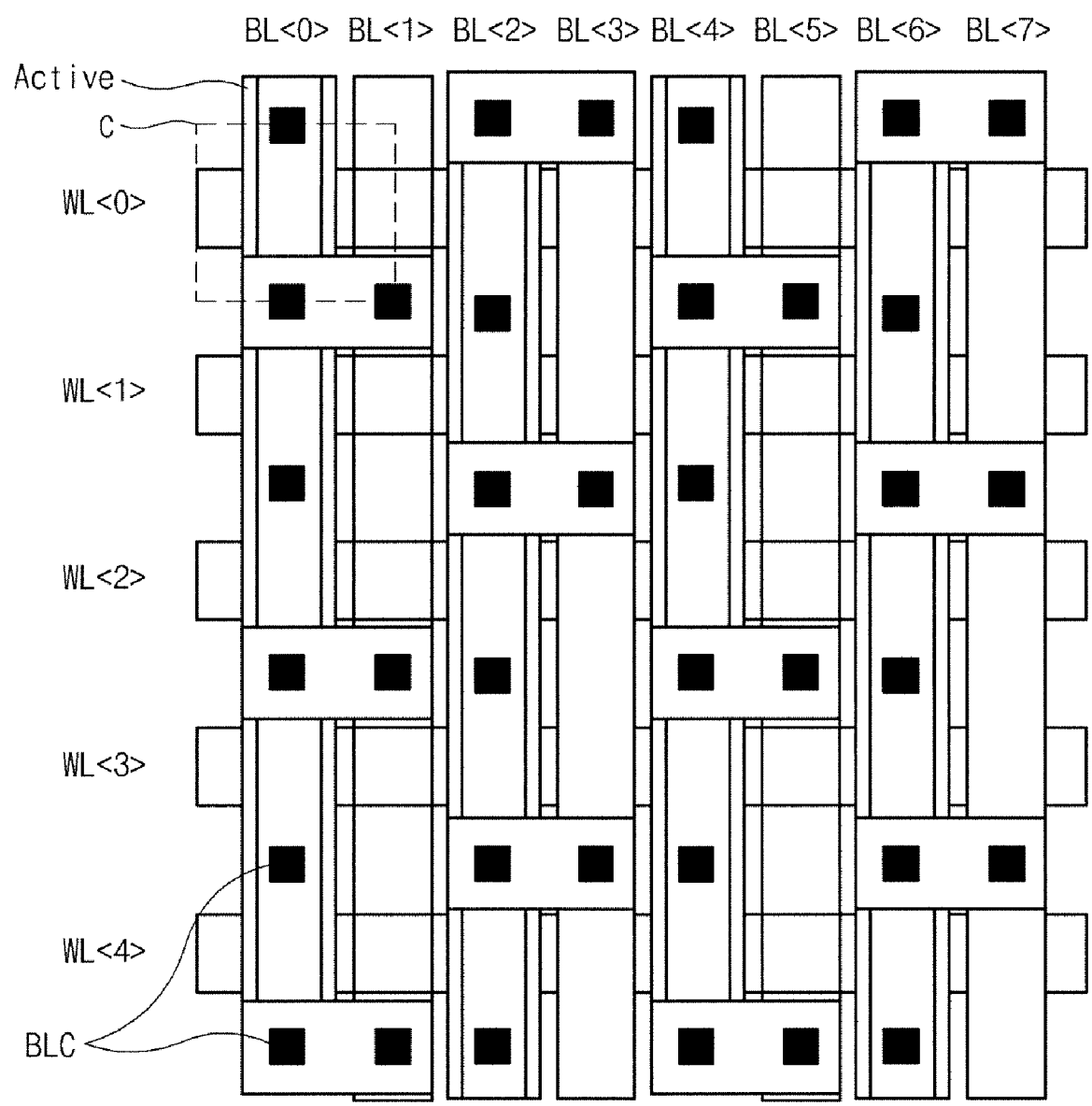
FIG. 5 is a layout diagram illustrating a cell array of a semiconductor memory device consistent with the present invention.

FIG. 5 is a plane diagram illustrating a cell array of a semiconductor memory device according to an embodiment consistent with the present invention.

The cell array comprises a plurality of word lines WL arranged in a row direction. A plurality of bit lines BL are arranged perpendicularly to the plurality of word lines WL (in a column direction). A plurality of unit cells C are disposed in a region where the plurality of word lines WL are crossed with the plurality of bit lines BL.

Odd bit lines BL<1>, BL<3>, BL<5>, BL<7>, BL<9> are alternately arranged with even bit lines BL<0>, BL<2>, BL<4>, BL<6>, BL<8> each in a different layer. When one unit cell C is connected to two bit lines BL, the area of bit line BL is prevented from being increased.

That is, even bit lines BL<0>, BL<2>, BL<4>, BL<6>, BL<8> are formed in an upper or lower layer of the odd bit lines BL<1>, BL<3>, BL<5>, BL<7>, BL<9>. Odd bit lines BL<1>, BL<3>, BL<5>, BL<7>, BL<9> are formed in an upper or lower layer of even bit lines BL<0>, BL<2>, BL<4>, BL<6>, BL<8>.

The unit cell C comprises a word line WL and two bit lines BL arranged in a different layer. For example, the unit cell C comprises a word line WL<0>, an even bit line BL<2> and an odd bit line BL<3> which are connected through a bit line contact BLC.

Figure 6:
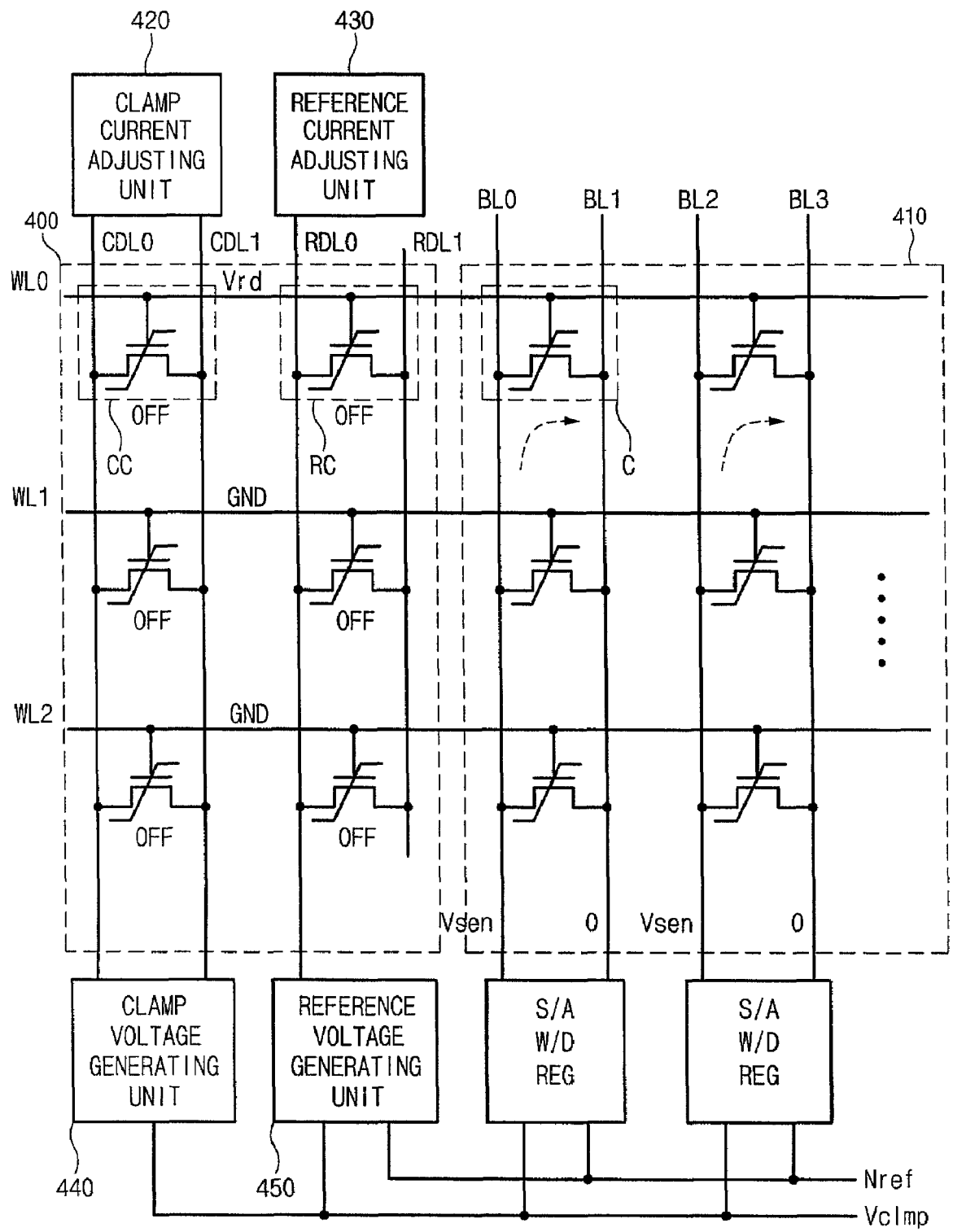
FIG. 6 is illustrating a cell array structure and a read operation of a semiconductor memory device consistent with the present invention.

FIG. 6 is illustrating a cell array structure and a read operation of a semiconductor memory device consistent with the present invention.

The semiconductor memory device of FIG. 6 comprises a dummy cell array 400, a cell array 410, a clamp current adjusting unit 420, a reference current adjusting unit 430, a clamp voltage generating unit 440 and a reference voltage generating unit 450.

In dummy cell array 400, a plurality of word lines WL are arranged in a row direction. A pair of clamp dummy lines CDL0, CDL1 and a pair of reference dummy lines RDL0, RDL1 are arranged in a column direction.

A plurality of clamp cells CC are disposed where the plurality of word lines WL are crossed with the paired clamp dummy lines CDL0, CDL1. A plurality of reference cells RC are located where the plurality of word lines WL are crossed with the paired reference dummy lines RDL0, RDL1. Clamp cells CC and the reference cells RC of the dummy cell array 400 are kept off to operate as replica cells where no current flows.

Dummy cell array 400 can include clamp cells CC and reference cells RC that reflect a characteristic of a main cell to generate a clamp voltage and a reference voltage, thereby increasing the efficiency of the sense amplifier.

Clamp cell CC, connected between the paired clamp dummy lines CDL0, CDL1, has a gate connected to word line WL. Reference cell RC, connected between paired reference dummy lines RDL0, RDL1, has a gate connected to word line WL.

In cell array 410, a plurality of word lines WL are arranged in a row direction with a given interval. A plurality of bit lines BL are arranged each perpendicular to the plurality of word lines WL, that is, in a column direction. A plurality of unit cells C are located in a region where the plurality of word lines WL are crossed with the plurality of bit lines BL.

Unit cell C having a 1-T FET structure is connected to word line WL<0> and bit lines BL<0>, BL<1> formed in a different layer. Although word line WL<0> and bit lines BL<0>, BL<1> are exemplified in the embodiment consistent with the present invention, the present invention can be applied to rest word lines WL<1>, WL<2>, . . . and rest bit line pairs BL<2>, BL<3>, . . . .

Unit cell C has a drain and a source connected between paired bit lines BL<0>, BL<1>, and a gate connected to word line WL<0>. The paired bit lines BL<0>, BL<1> arranged in a different layer are connected to a sense amplifier S/A, a write driver W/D and a register REG.

Sense amplifier S/A senses and amplifies cell data to distinguish data "1" from data "0" so that sense amplifier S/A is connected to paired bit lines BL<0>, BL<1>. Sense amplifier S/A has a reference voltage terminal to receive a reference voltage Nref and a clamp voltage Vclmp, thereby controlling a cell current Isen.

When data are written in the memory cell, write driver W/D is configured to generate a driving voltage depending on write data so as to supply the driving voltage to bit line BL. Write driver W/D is connected to paired bit lines BL<0>, BL<1>.

Register REG as a temporary memory element for storing data of sense amplifier S/A temporarily is connected to paired bit lines BL<0>, BL<1>.

In a read mode of the cell array, a read voltage Vrd is applied to selected word line WL<0>, and a ground voltage GND is applied to unselected word lines WL<1>, WL<2>.

A sensing bias voltage Vsen for sensing a sensing current of the unit cell C is applied to bit line BL<0> of paired bit lines BL<0>, BL<1> connected to the unit cell C. The ground voltage is applied to bit line BL<1>.

A cell sensing current Isen flows depending on a storage state of cell data. As a result, currents flowing in paired bit lines BL<0>, BL<1> becomes different depending on the polarity of ferroelectric layer 4 so as to read cell data stored in unit cell C.

That is, the read voltage Vrd is applied to selected word line WL<0>, and ground voltage GND is applied to unselected word lines WL<1>, WL<2>. The sensing bias voltage Vsen for sensing a sensing current of the cell is applied to even bit line BL<0>, and the ground voltage GND is applied to odd bit line BL<1>. Depending on the storage state of the cell data, the sense amplifier S/A senses a value of the cell sensing current Isen flowing in bit line BL<0> to read the cell data.

When a channel region of the memory cell is turned off, the value of the cell sensing current Isen is sensed so that data "1" stored in the memory cell can be read. On the other hand, when the channel region is turned on, the value of the cell sensing current Isen is sensed so that data "0" stored in the memory cell can be read.

The clamp current adjusting unit 420 connected to the paired clamp dummy lines CDL0, CDL1 adjusts a current flowing in the paired clamp dummy line CDL0, CDL1. The reference current adjusting unit 430 connected to the reference dummy line RDL0 adjusts a current flowing in the reference dummy line RDL0.

Clamp voltage generating unit 440 shared by the paired clamp dummy line CDL0, CDL1 generates the clamp voltage Vclmp depending on a clamp current flowing in the clamp dummy lines CDL0, CDL1. The reference voltage generating unit 450 connected to the reference dummy line RDL0 generates the reference voltage Nref depending on a reference current flowing in the reference dummy line RDL0.

The positive read voltage Vrd and other voltages supplied from selected word line WL<0> are transmitted from the row decoder. Korean Patent Application No. 10-2007-0065033 discloses the configuration of the row decoder configured to supply voltages.

Figure 7:
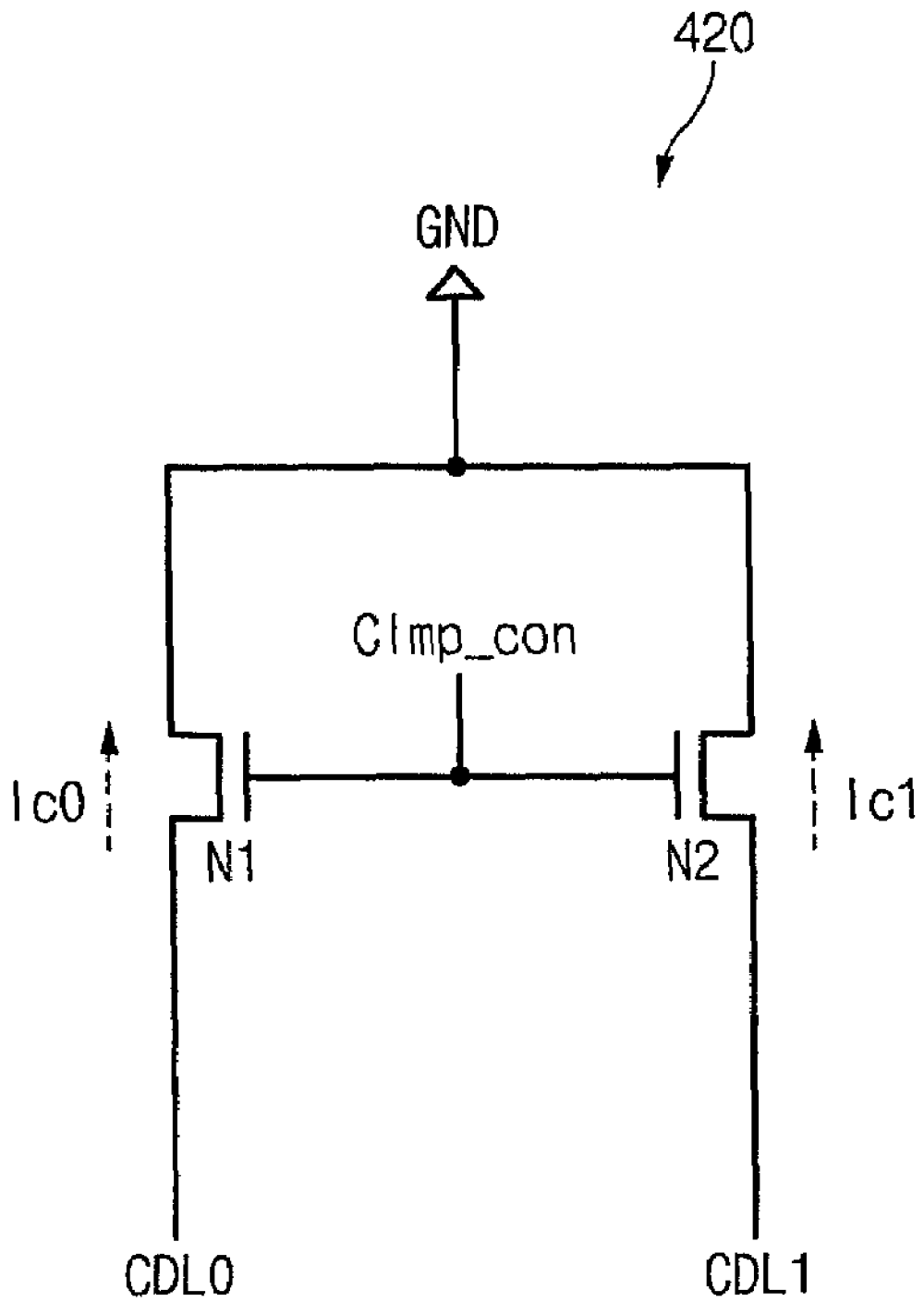
FIG. 7 is a circuit diagram illustrating a clamp current adjusting unit of FIG. 6 consistent with the present invention.

FIG. 7 is a circuit diagram illustrating the clamp current adjusting unit 420 of FIG. 6.

Clamp current adjusting unit 420 comprises NMOS transistors N1, N2 as a current adjusting element. The NMOS transistor N1, connected between the clamp dummy line CDL0 and the ground voltage terminal, flows a clamp current Ic0. The NMOS transistor N2, connected between the clamp dummy line CDL1 and the ground voltage terminal, flows a clamp current Ic1. A common gate of NMOS transistors N1, N2 receives a clamp control signal Clmp_con.

Clamp current adjusting unit 420 adjusts the flowing of clamp currents Ic0, Ic1 flowing from clamp voltage generating unit 440 and clamp dummy lines CDL0, CDL1. A current flowing in the clamp dummy lines CDL0, CDL1 can be set under the same condition as that of the characteristic of the cell with NMOS transistors N1, N2.

Figure 8:
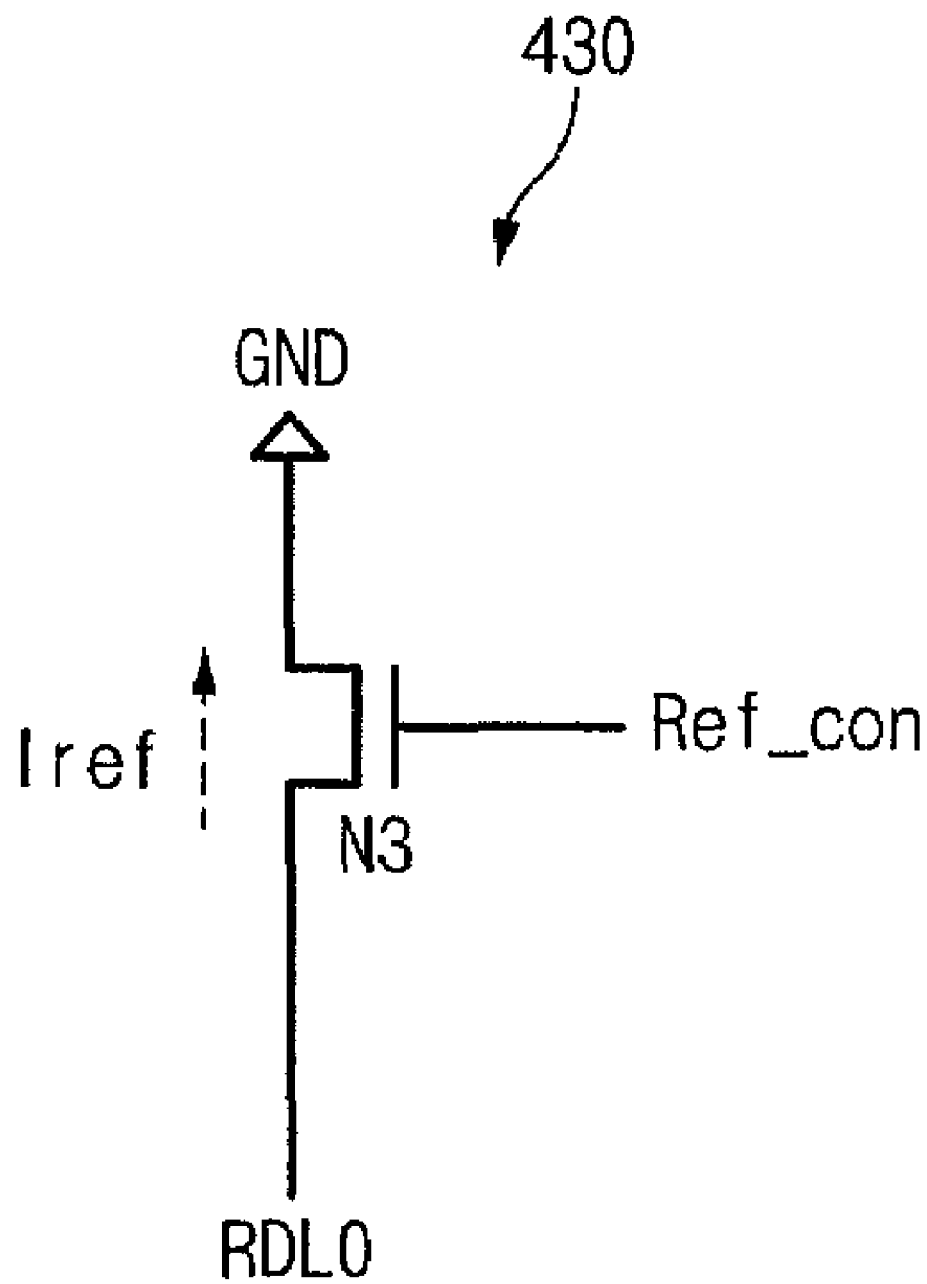
FIG. 8 is a timing diagram illustrating a reference current adjusting unit of FIG. 6 consistent with the present invention.

FIG. 8 is a timing diagram illustrating the reference current adjusting unit 430 of FIG. 6.

The reference current adjusting unit 430 includes a NMOS transistor N3. The NMOS transistor N3, connected between the reference dummy line RDL0 and the ground GND voltage terminal, has a gate to receive a reference control signal Ref_con. NMOS transistor N3 adjusts a reference current Iref flowing from the reference voltage generating unit 450 through the reference dummy line RDL0 to ground GND terminal.

Reference current adjusting unit 430 adjusts the reference current Iref flowing from the reference voltage generating unit 450 to the reference dummy line RDL0. A current flowing in the reference dummy line RDL0 can be set under the same condition as that of the characteristic of the cell with NMOS transistor N3.

Figure 9:
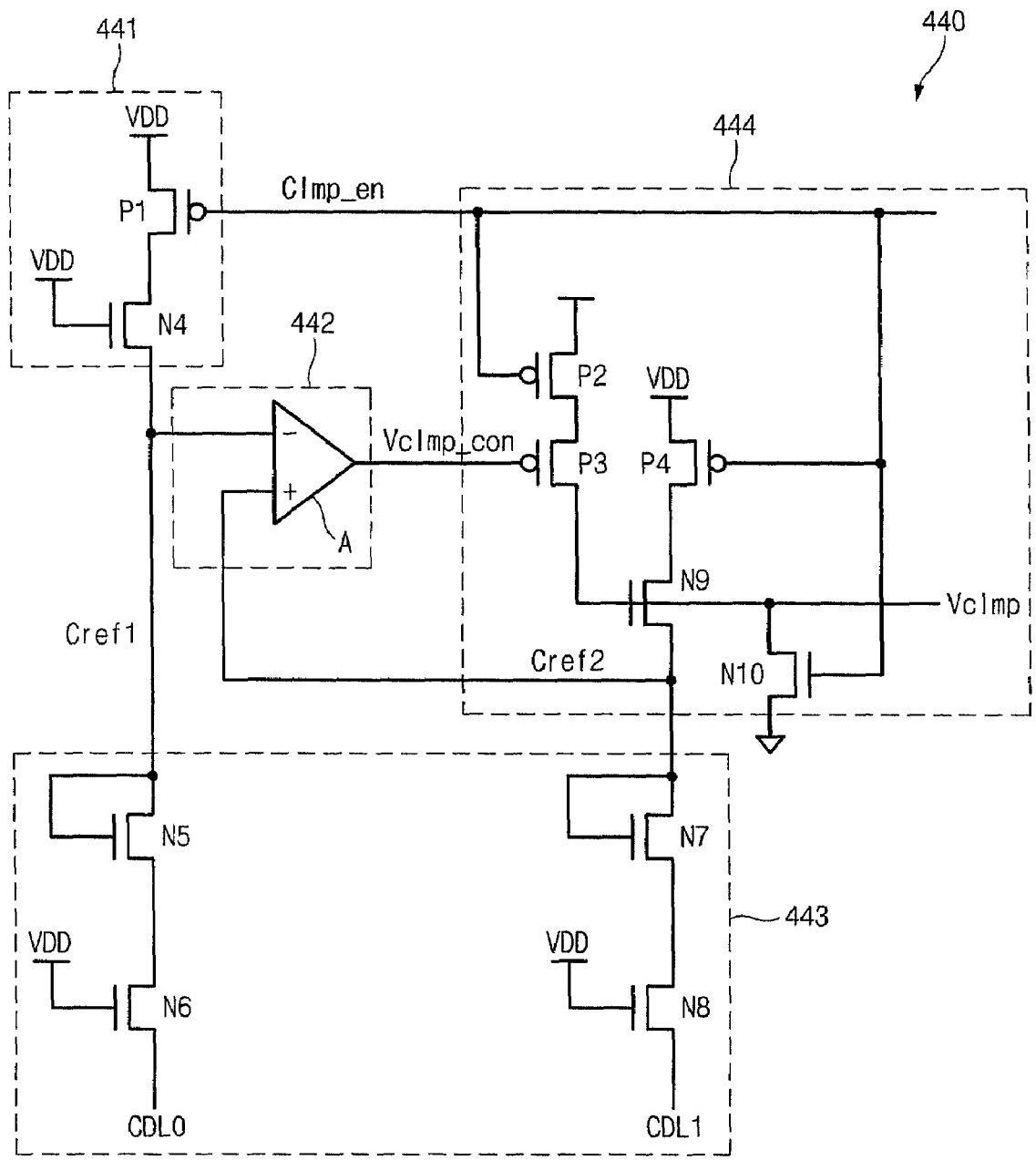
FIG. 9 is a circuit diagram illustrating a clamp voltage generating unit FIG. 6 consistent with the present invention.

FIG. 9 is a circuit diagram illustrating the clamp voltage generating 440 unit FIG. 6.

Clamp voltage generating unit 440 includes a reference bias unit 441, a clamp voltage adjusting unit 442, a bias adjusting unit 443 and a clamp voltage output unit 444.

Reference bias unit 441 includes a PMOS transistor P1 and a NMOS transistor N4. PMOS transistor P1, connected between a power voltage VDD terminal and NMOS transistor N4, has a gate to receive a clamp enable signal Clmp_en. NMOS transistor N4, connected between PMOS transistor P1 and a clamp reference signal Cref1 terminal, has a gate to receive a power voltage VDD.

Clamp voltage adjusting unit 442 including an amplifier A outputs a clamp voltage control signal Vclmp_con. The amplifier A has a negative (−) terminal to receive a clamp reference signal Cref1. The amplifier A has a positive (+) terminal to receive a clamp reference signal Cref2.

Bias adjusting unit 443 includes NMOS transistors N5~N8. NMOS transistors N5, N6 are connected between clamp reference signal Cref1 terminal and clamp dummy line CDL0. NMOS transistor N5 has a gate connected to clamp reference signal Cref1 terminal, and NMOS transistor N6 has a gate to receive power voltage VDD.

NMOS transistors N7, N8 are connected between a clamp reference signal Cref2 terminal and clamp dummy line CDL1. NMOS transistor N7 has a gate connected to clamp reference signal Cref2 terminal, and NMOS transistor N8 has a gate to receive power voltage VDD.

Clamp voltage output unit 444 includes PMOS transistors P2~P4, NMOS transistors N9, N10. PMOS transistor P2, connected between power voltage terminal and PMOS transistor P3, has a gate to receive the clamp enable signal Clmp_en. PMOS transistor P3, connected between PMOS transistor P2 and a gate of NMOS transistor N9, has a gate to receive clamp voltage control signal Vclmp_con.

PMOS transistor P4, connected between power voltage VDD terminal and NMOS transistor N9, has a gate to receive clamp enable signal Clmp_en. NMOS transistor N9, connected between PMOS transistor P4 and clamp reference signal Cref2 terminal, has a gate connected to clamp voltage Vclmp terminal. NMOS transistor N10, connected between clamp voltage Vclmp terminal and ground voltage terminal, has a gate to receive clamp enable signal Clmp_en.

The operation of the clamp voltage generating unit 440 is explained as follows.

Reference bias unit 441 is configured to generate a reference voltage for generating clamp voltage Vclmp. Reference bias unit 441 sets a load value so that a current value of clamp reference signal Cref1 flowing in the clamp dummy line CDL0 may be constant.

Reference bias unit 441 is activated by clamp enable signal Clmp_en. A given target current value is determined by NMOS transistor N4.

Clamp voltage adjusting unit 442 is an amplifying circuit configured to receive clamp reference signal Cref1 so that clamp reference signal Cref2 is determined. That is, the amplifier A adjusts the clamp reference signal Cref2 in response to clamp reference signal Cref1 to output the clamp voltage control signal Vclmp_con.

Bias adjusting unit 443 is configured to control input bias of clamp reference signal Cref1, Cref2. In NMOS transistors N5, N7 as a positive slope resistor, a voltage of a source and a drain rises when a power voltage rises so that a threshold voltage rises. As a result, a voltage drops to increase an effective resistance.

NMOS transistors N6, N8 as a negative slope resistor may have a source connected to the clamp dummy lines CDL0, CDL1, respectively, and a drain connected to the NMOS transistors N5, N7. When the power voltage rises, NMOS transistors N6, N8 increases a current to decrease an effective resistance. As a result, resistors having an opposite characteristic are connected serially to maintain a constant voltage of clamp reference signal Cref1, Cref2 terminals.

Clamp voltage output unit 444 is configured to control output of clamp voltage Vclmp. Clamp voltage output unit 444 is activated by clamp enable signal Clmp_en.

When the clamp enable signal Clmp_en is inactivated to a high level, NMOS transistor N10 is turned on to maintain the clamp voltage Vclmp at the ground voltage level. When clamp enable signal Clmp_en is activated to a low level, PMOS transistors P1, P2, P4 are activated.

PMOS transistor P3 controls the clamp voltage Vclmp in response to the clamp voltage control signal Vclmp_con. NMOS transistor N9 determines a voltage of the clamp reference signal Cref2 depending on the clamp voltage Vclmp.

Clamp reference signal Cref2 is inputted into the positive (+) terminal of the amplifier A to adjust the clamp voltage Vclmp. As a result, the clamp reference signals Cref1, Cref2 maintain a given offset voltage.

Figure 10:
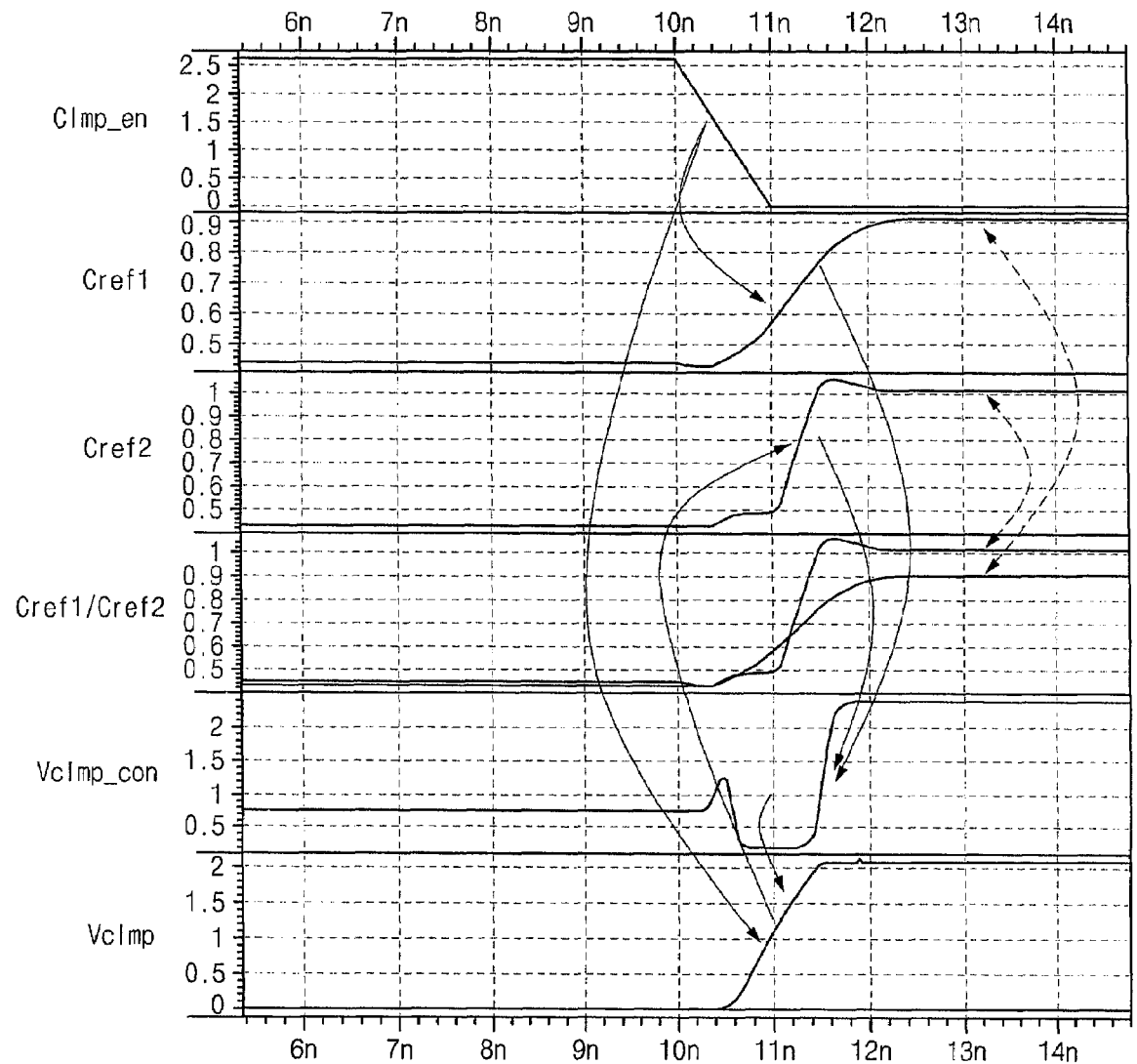
FIG. 10 is a timing diagram illustrating the operation of the clamp voltage generating unit of FIG. 9 consistent with the present invention.

FIG. 10 is a timing diagram illustrating the operation of the clamp voltage generating unit 440 of FIG. 9.

At a standby state, the clamp enable signal Clmp_en is kept inactivated at the high level. As a result, the clamps reference signals Cref1, Cref2, the clamp voltage control signal Vclmp_con and the clamp voltage Vclmp are kept 'low'.

When clamp enable signal Clmp_en is activated to a low level, PMOS transistor P1 is turned on. As a result, a voltage of the clamp reference signal Cref1 rises to a given bias voltage level.

A voltage of the clamp reference signal Cref2 rises after a given time so that clamp voltage control signal Vclmp_con becomes 'low'. PMOS transistor P3 is turned on in response to the clamp voltage control signal Vclmp_con so that a level of the clamp voltage Vclmp rises.

When the clamp voltage Vclmp rises, the clamp reference signal Cref2 starts to rise. When a voltage difference of the clamp reference signals Cref1, Cref2 reaches a target offset voltage, a voltage of the clamp voltage control signal Vclmp_con rises to a high level. As a result, the level of the clamp voltage Vclmp rises no longer.

Figure 11:
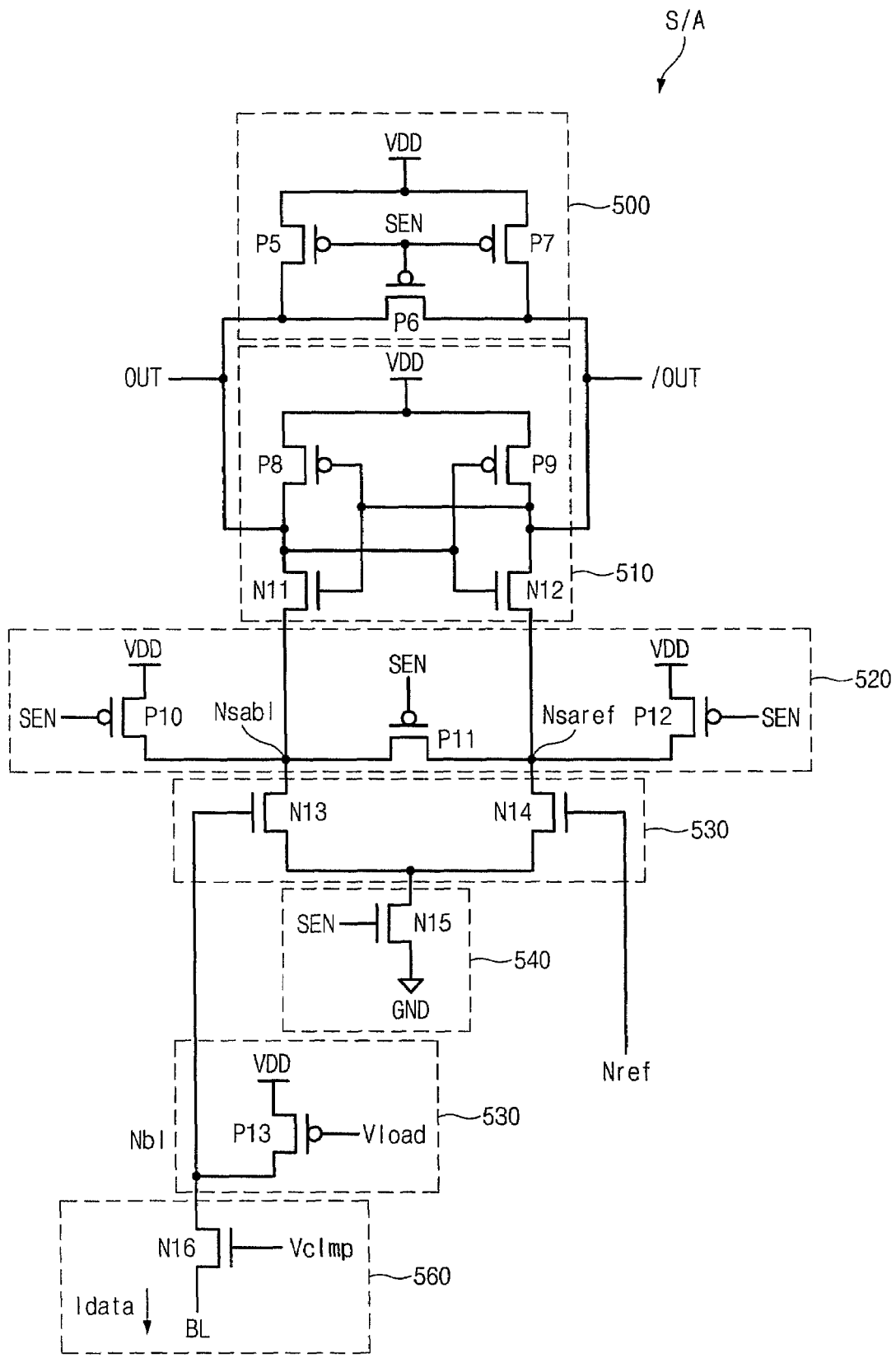
FIG. 11 is a circuit diagram illustrating a sense amplifier of FIG. 6 consistent with the present invention.

FIG. 11 is a circuit diagram illustrating sense amplifier S/A of FIG. 6.

Sense amplifier S/A includes an equalizing unit 500, an amplifying unit 510, a pull-up unit 520, an amplifying unit 530, an amplifying activation control unit 540, a current sensing load unit 550 and a bit line voltage bias control unit 560.

Equalizing unit 500 includes PMOS transistors P5~P7. PMOS transistor P5 is connected between power voltage VDD terminal and an output terminal OUT. PMOS transistor P7 is connected between power voltage VDD terminal and an output terminal /OUT. PMOS transistor P6 is connected between output terminals OUT, /OUT. PMOS transistors P5~P7 have a common gate to receive a sense amplifier enable signal SEN.

Amplifying unit 510 includes PMOS transistors P8, P9 and NMOS transistors N11, N12. PMOS transistors P8, P9 are cross-coupled with NMOS transistors N11, N12.

Pull-up unit 520 includes PMOS transistors P10~P12. PMOS transistor P10 is connected between power voltage VDD terminal and a node Nsabl. PMOS transistor P11 is connected between the node Nsabl and a node Nsaref. PMOS transistor P12 is connected between power voltage VDD terminal and node Nsaref. PMOS transistors P10~P12 have a common gate to receive sense amplifier enable signal SEN.

Amplifying unit 530 includes NMOS transistors N13, N14. NMOS transistor N13 connected between the node Nsabl and the NMOS transistor N15, has a gate connected to a node Nbl. NMOS transistor N14, connected between node Nsaref and NMOS transistor N15, has a gate to receive reference voltage Nref.

Amplifying activation control unit 540, connected between amplifying unit 530 and ground voltage GND terminal, has a gate to receive sense amplifier enable signal SEN.

Current sensing load unit 550 includes a PMOS transistor P13. PMOS transistor P13, connected between power voltage VDD terminal and node Nbl, has a gate to receive a load voltage Vload.

Bit line voltage bias control unit 560 includes a NMOS transistor N16. NMOS transistor N16, connected between node Nbl and bit line BL, has a gate to receive clamp voltage Vclmp.

Figure 12:
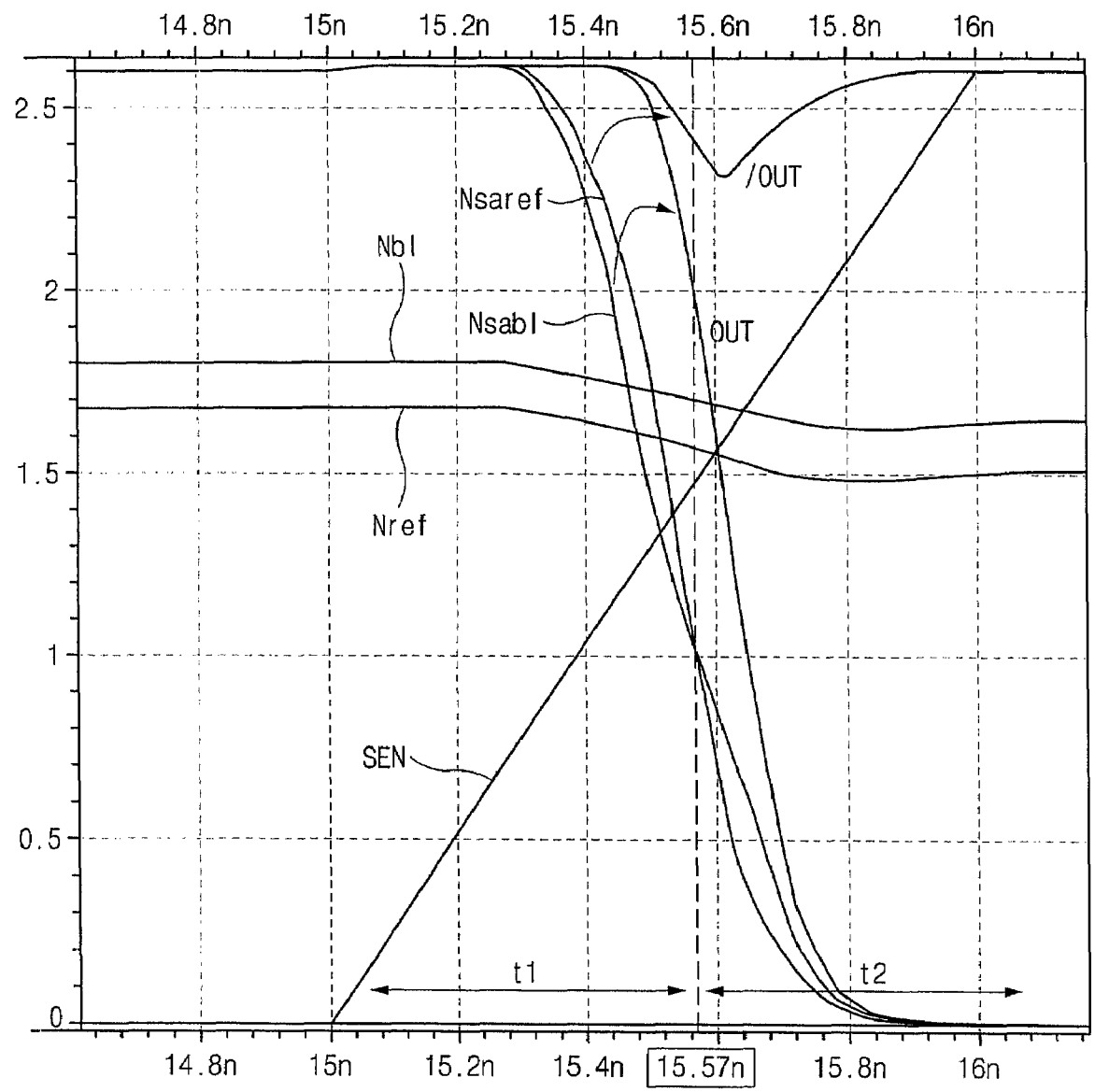
FIG. 12 is a waveform diagram illustrating first and second amplifying terminals in the sense amplifier of FIG. 11 consistent with the present invention.

FIG. 12 is a waveform diagram illustrating first and second amplifying terminals in sense amplifier S/A of FIG. 11.

When the clamp voltage Vclmp rises, NMOS transistor N16 is turned on to transmit a bit line current of the main cell into the node Nbl. A gate voltage of the NMOS transistor N16 is controlled by the clamp voltage Vclmp.

Current sensing load unit 550 includes a PMOS transistor P13 controlled by load voltage Vload. A current of bit line BL is converted into a sensing voltage value in node Nbl by a load value of PMOS transistor P13.

Amplifying activation control unit 540 is controlled by sense amplifier enable signal SEN. Amplifying units 510 and 530 are activated depending on a state of amplifying activation control unit 540. Amplifying unit 530 amplifies voltages of node Nbl and reference voltage Nref using gains of NMOS transistors N13, N14.

Both nodes Nsabl, Nsaref terminals are precharged to a high level depending on the operation of the pull-up unit 520 during a precharge period. As a result, an amplifying characteristic of sense amplifier S/A is improved. That is, both nodes Nsabl, Nsaref terminals are pulled down in the period t1 to have an amplified voltage value. The voltage amplified in amplifying unit 530 is transmitted into amplifying unit 510 to improve a second amplifying unit.

Amplifying unit 510 amplifies the gains of amplifying unit 530 to improve an offset characteristic of sense amplifier S/A. Equalizing unit 500 precharges an output signal of amplifying unit 510 to a high level during the precharge period.

Figure 13:
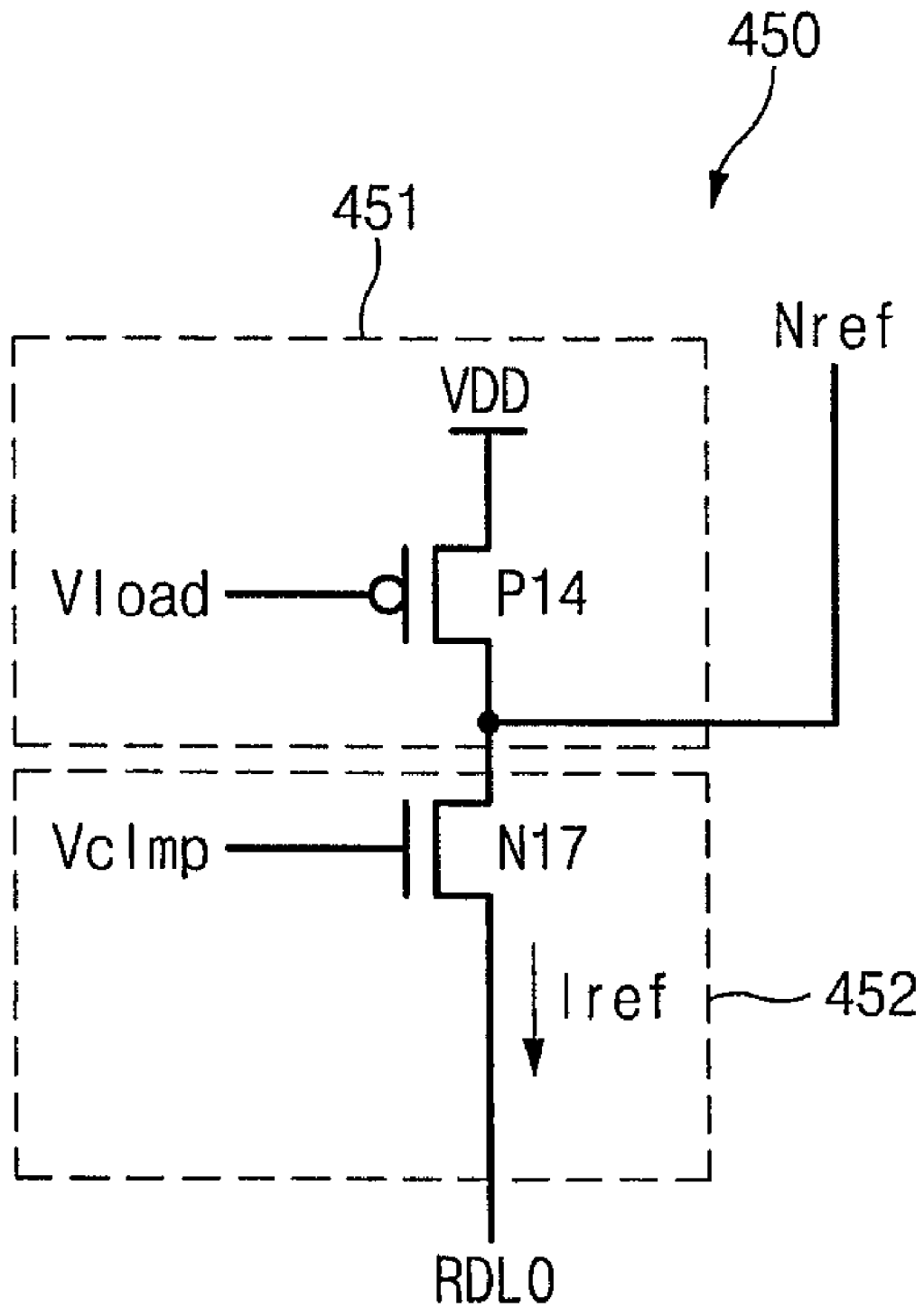
FIG. 13 is a circuit diagram illustrating a reference voltage generating unit of FIG. 6 consistent with the present invention.

FIG. 13 is a circuit diagram illustrating the reference voltage generating unit 450 of FIG. 6.

Reference voltage generating unit 450 includes a current sensing load unit 451 and a bit line voltage bias control unit 452.

Current sensing load unit 451 includes a PMOS transistor P14. PMOS transistor P14, connected between power voltage VDD terminal and reference voltage Nref terminal, has a gate to receive load voltage Vload.

Bit line voltage bias control unit 452 includes a NMOS transistor N17. NMOS transistor N17, connected between reference voltage Nref terminal and reference dummy line RDL0, has a gate to receive clamp voltage Vclmp.

In the reference voltage generating unit 450, a gate voltage of NMOS transistor N17 is controlled by clamp voltage Vclmp. Reference current Iref is converted into a reference voltage value in reference voltage Nref terminal by a load value of PMOS transistor P14.

Figure 14:
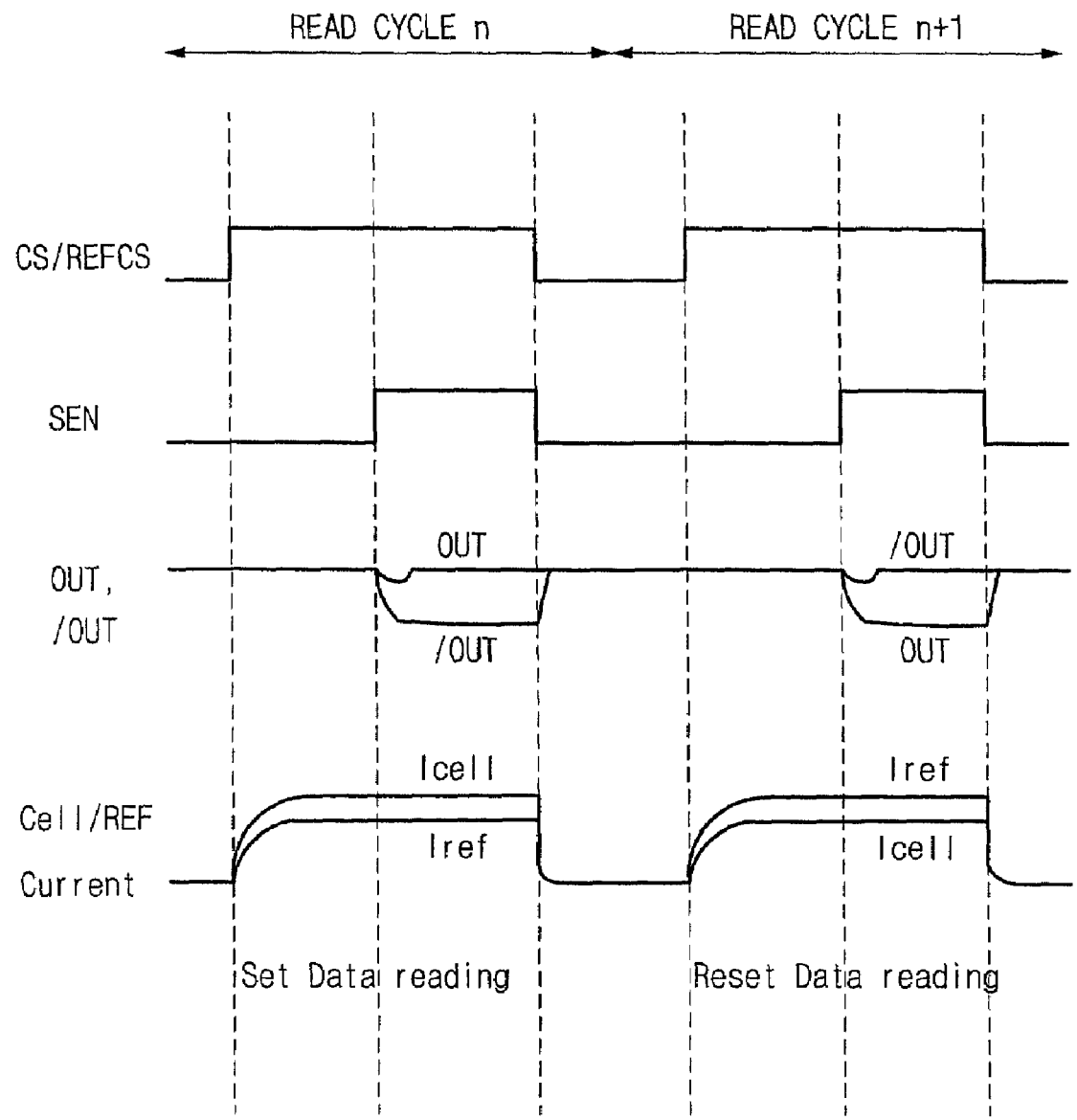
FIG. 14 is a timing diagram illustrating an operating voltage of the sense amplifier of FIG. 11 consistent with the present invention.

FIG. 14 is a timing diagram illustrating the operating voltage of sense amplifier S/A of FIG. 11. FIG. 14 shows the current sensing operation of the data "1" and "0" in two read cycles.

In a read cycle n, when a column selecting switch CS and a reference column selecting switch REFCS are activated, a cell current and a reference REF current start to flow. After a given time, a voltage of the output terminals OUT, /OUT is amplified when sense amplifier enable signal SEN is activated. Since cell current Icell is larger than reference current Iref, output terminal OUT is outputted at a high level and output terminal /OUT is outputted at a low level.

In a read cycle n+1, when the column selecting switch CS and the reference column selecting switch REFCS are activated, the cell current and reference REF current start to flow. After a given time, a voltage of output terminals OUT, /OUT is amplified when the sense amplifier enable signal SEN is activated. Since the cell current Icell is smaller than the reference current Iref, the output terminal OUT is outputted at a low level and the output terminal /OUT is outputted at a high level.

As described above, according to an embodiment consistent with the present invention, a DRAM equipped with a 1T-FET type ferroelectric memory cell having a nonvolatile characteristic generates a clamp voltage and a reference voltage that reflect a characteristic of a main cell, thereby increasing a sensing efficiency of a sense amplifier.

As a result, the DRAM improves a data retention characteristic without losing refresh state information even when a power source is off.

The above embodiments of the present invention are illustrative and not limitative. Various alternatives and equivalents are possible. The invention is not limited by the type of deposition, etching polishing, and patterning steps described herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A semiconductor memory device including a one-transistor (1-T) field effect transistor (FET) type memory cell where a different channel resistance is induced to a channel region depending on a polarity state of a ferroelectric layer, the device comprising:
   a plurality of word lines arranged in a row direction;
   a plurality of bit lines arranged in a column direction;
   a pair of clamp dummy lines arranged in the column direction;
   a pair of reference dummy lines arranged in the column direction;
   a cell array including the memory cell and formed in a region where the word line and the bit lines are crossed;
   a dummy cell array including the memory cell and formed where the word line, the pair of clamp dummy lines and the pair of reference dummy lines are crossed; and
   a sense amplifier and a write driving unit connected to the bit line and configured to receive a clamp voltage and a reference voltage.

2. The semiconductor memory device according to claim 1, wherein the dummy cell array is kept off in a read mode.

3. The semiconductor memory device according to claim 1, wherein the dummy cell array comprises:
   a clamp cell connected between the pair of clamp dummy lines and having a gate connected to a different word line; and
   a reference cell connected between the pair of reference dummy lines and having a gate connected to a different word line.

4. The semiconductor memory device according to claim 1, wherein the paired bit lines are connected to the sense amplifier and the write driving unit.

5. The semiconductor memory device according to claim 1, further comprising a register configured to store data amplified in the sense amplifier.

6. The semiconductor memory device according to claim 1, further comprising:
   a clamp current adjusting unit configured to adjust a clamp current of the paired clamp dummy lines;
   a reference current adjusting unit configured to adjust a reference current of the paired reference dummy lines;
   a clamp voltage generating unit connected to the paired clamp dummy lines and configured to generate the clamp voltage; and
   a reference voltage generating unit connected to the paired reference dummy lines and configured to generate the reference voltage.

7. The semiconductor memory device according to claim 6, wherein the clamp current adjusting unit comprises a current adjusting element configured to control a current flowing in the paired clamp dummy lines in response to a clamp control signal.

8. The semiconductor memory device according to claim 7, wherein the current adjusting element comprises first and second NMOS transistors which are connected between the paired clamp dummy lines and the ground voltage terminal and have a common gate to receive the clamp control signal.

9. The semiconductor memory device according to claim 6, wherein the reference current adjusting unit is connected to one of the paired reference dummy lines.

10. The semiconductor memory device according to claim 9, wherein the reference current adjusting unit comprises a third NMOS transistor that is connected between the reference dummy line and the ground voltage terminal and has a gate to receive the clamp control signal.

11. The semiconductor memory device according to claim 6, wherein the clamp voltage generating unit comprises:
   a bias adjusting unit configured to maintain a voltage of the paired clamp dummy lines at a given bias voltage so as to output first and second clamp reference signals;
   a reference bias unit configured to supply a bias voltage to the first clamp reference signal;
   a clamp voltage adjusting unit configured to output a clamp voltage control signal for adjusting the clamp voltage corresponding to a voltage value of the first and second clamp reference signals; and
   a clamp voltage output unit configured to output the clamp voltage in response to the clamp voltage control signal.

12. The semiconductor memory device according to claim 11, wherein the bias adjusting unit comprises:
   a positive slope resistance adjusting unit configured to increase an effective resistance depending on a power voltage; and a negative slope resistance adjusting unit configured to decrease an effective resistance depending on the power voltage.

13. The semiconductor memory device according to claim 12, wherein the positive slope resistance adjusting unit comprises first and second MOS transistors having a common gate and source to receive the first and second clamp reference signals.

14. The semiconductor memory device according to claim 12, wherein the negative slope resistance adjusting unit comprises third and fourth MOS transistors which are connected between the positive slope resistance adjusting unit and the paired clamp dummy lines and have a gate to receive the power voltage.

15. The semiconductor memory device according to claim 11, wherein the reference bias unit comprises:
 a first PMOS transistor configured to selectively supply a power voltage in response to a clamp enable signal; and
 a fourth NMOS transistor connected to the first PMOS transistor and the first clamp reference signal and having a gate to receive the power voltage.

16. The semiconductor memory device according to claim 11, wherein the clamp voltage adjusting unit comprises an amplifier configured to compare and amplify the first and second clamp reference signals so as to output the clamp voltage control signal.

17. The semiconductor memory device according to claim 11, wherein the clamp voltage output unit controls the clamp voltage level in response to the clamp voltage control signal when the clamp enable signal is activated and pulls down the clamp voltage when the clamp enable signal is inactivated.

18. The semiconductor memory device according to claim 11, wherein the clamp voltage output unit comprises:
 second and third PMOS transistors configured to be activated in response to the clamp enable signal;
 a fifth NMOS transistor configured to control the clamp voltage level in response to the clamp voltage control signal;
 a sixth NMOS transistor configured to control a voltage of the second clamp reference signal depending on the clamp voltage; and
 a seventh NMOS transistor configured to pull-down the clamp voltage when the clamp voltage control signal is inactivated.

19. The semiconductor memory device according to claim 6, wherein the reference voltage generating unit comprises:
 a current sensing load unit configured to control load of the reference voltage depending on a load voltage; and
 a bit line voltage bias control unit configured to control the reference voltage flowing in a reference dummy line depending on the clamp voltage.

20. The semiconductor memory device according to claim 19, wherein the current sensing load unit comprises a fourth PMOS transistor connected between the power voltage terminal and the reference voltage terminal and having a gate to receive the load voltage.

21. The semiconductor memory device according to claim 19, wherein the bit line voltage bias control unit comprises an eighth NMOS transistor connected between the reference voltage terminal and the reference dummy line and having a gate to receive the clamp voltage.

22. The semiconductor memory device according to claim 1, wherein the sense amplifier comprises:
 an amplifying unit configured to amplify a voltage of the output terminal depending on the bit line voltage and the reference voltage;
 an equalizing unit configured to pre-charge the output terminal during a pre-charge period;
 a pull-up unit configured to pull up both nodes of the amplifying unit during the pre-charge period;
 an amplifying activation control unit configured to control activation of the amplifying unit in response to a sense amplifier enable signal;
 a current sensing load unit configured to control a voltage of the bit line depending on a load voltage; and
 a bit line voltage bias control unit configured to a current of the bit line depending on the clamp voltage.

23. The semiconductor memory device according to claim 22, wherein the amplifying unit comprises:
 a first amplifying unit configured to amplify the voltage of the bit line and a voltage of the reference voltage terminal; and
 a second amplifying unit configured to amplify a voltage of the first amplifying unit.

\* \* \* \* \*